United States Patent
Gillespie (12)

(10) Patent No.: US 6,175,154 B1
(45) Date of Patent: Jan. 16, 2001

(54) FULLY ENCAPSULATED METAL LEADS FOR MULTI-LEVEL METALLIZATION

(75) Inventor: Paul Matthew Gillespie, Allen, TX (US)

(73) Assignee: Texas Instruments Incorporated, Dallas, TX (US)

(*) Notice: Under 35 U.S.C. 154(b), the term of this patent shall be extended for 0 days.

(21) Appl. No.: 08/991,169

(22) Filed: Dec. 16, 1997

Related U.S. Application Data

(60) Provisional application No. 60/033,361, filed on Dec. 18, 1996.

(51) Int. Cl.[7] .................................................. H01L 29/40
(52) U.S. Cl. ......................... 257/750; 438/688; 438/653
(58) Field of Search ................................... 438/597, 650, 438/683, 687, 688, 656, 625, 643, 644, 653, 654; 257/750, 751, 788, 773, 763, 765, 775

(56) References Cited

U.S. PATENT DOCUMENTS 5,332,693 * 7/1994 Kim .
5,909,635 * 6/1999 Manieb et al. ...................... 438/625

OTHER PUBLICATIONS

Donald S. Gardner, et al. "Encapsulated Copper Interconnection Devices Using Sidewall Barriers", 8th International VMIC Conf. pp. 99–108, Jun. 1991.*

* cited by examiner

Primary Examiner—Caridad Everhart
(74) Attorney, Agent, or Firm—Jacqueline J. Garner; W. James Brady, III; Frederick J. Telecky, Jr.

(57) ABSTRACT

A method of fabricating a lead for use in conjunction with a semiconductor device and the lead. A surface is provided which is disposed on a semiconductor substrate and has a via (5) with electrically conductive material (9) therein extending to the substrate. A lead is formed on the surface having an optional barrier layer (11) disposed on the surface and contacting the electrically conductive material (9). An electrically conductive metal layer (13) is formed which is disposed over and contacting the barrier layer (11) and has sidewalls. An anti-reflective coating (15) is formed on the electrically conductive metal layer (13) remote from the barrier layer (11). The electrically conductive metal layer (13) is encapsulated between the barrier layer (11) and the anti-reflective layer (15) with a composition taken from the class consisting of TiN, W, Ti, and $Si_3N_4$. The composition is then removed except from the sidewalls of the electrically conductive metal layer (13) to encapsulate the electrically conductive layer. The electrically conductive metal layer (13) is indented relative to the barrier layer (11) and the anti-reflective layer (15) to form an I-shape with the barrier layer and the anti-reflective layer.

15 Claims, 1 Drawing Sheet

FULLY ENCAPSULATED METAL LEADS FOR MULTI-LEVEL METALLIZATION

This application claims priority under 35 USC § 119(e)(1) of provisional application Ser. No. 06/033,361 filed Dec. 18, 1996.

BACKGROUND OF THE INVENTION

1. Field of the Invention

This invention relates to a fully encapsulated metal lead for multi-level interconnects for semiconductor applications and to the metal lead.

2. Brief Description of the Prior Art

In the fabrication of semiconductor devices, typical cross-sectional profiles of advanced multi-level metallization leads have been in the shape of an I-beam. In general, the lead is formed over an oxide layer and is connected to silicon or the like beneath the oxide layer through a via extending through the oxide layer which is filled with tungsten. This is accomplished by depositing a layer of titanium nitride into the via and over the oxide followed by a layer of chemically vapor deposited (CVD) tungsten (W) which fills the via and may extend over the titanium nitride. The tungsten is etched back in standard manner to leave tungsten only within the via as well as a layer of titanium nitride within the via and over the oxide. A layer of titanium nitride is then deposited, followed by a layer of aluminum alloy (about 0.5% copper (Cu) and then followed by a layer of titanium nitride. The upper layer of titanium nitride is then masked and an etchant is used to etch through the layers of titanium nitride, aluminum and the titanium nitride. Since the aluminum etches more rapidly than the titanium nitride, there is provided an I-shaped lead with exposed outer aluminum surfaces having an upper anti-reflective titanium nitride layer, etc., an intermediate aluminum alloy layer and a lower barrier metal layer of titanium nitride, titanium tungsten, etc.

A problem with leads having exposed surfaces is that of electromigration, though other properties of such leads can also be improved as will be discussed hereinbelow.

SUMMARY OF THE INVENTION

In accordance with the present invention, there is provided a fully encapsulated metal lead for multi-level interconnect for semiconductor applications. This is achieved by a chemical vapor deposition (CVD) film formed after metal etch followed by an isotropic etch to leave the encapsulating film on the edges or sidewalls of the lead. The top and bottom encapsulation layers are deposited by physical vapor deposition (PVD) as a three layer stack film such as, for example, TiN—Al alloy-TiN. By fully encapsulating metal leads, electromigration properties are enhanced, stress induced notching is reduced and the encapsulant also can act as a diffusion barrier.

The lead is fabricated over an oxide layer and is connected to silicon or the like beneath the oxide layer through a via extending through the oxide layer which is filled with tungsten as in the prior art. This is accomplished by depositing a layer of a barrier metal, preferably titanium nitride, titanium tungsten, as well as other well known barrier metals, into the via and over the oxide followed by a layer of chemically vapor deposited (CVD) tungsten (W), aluminum-filled vias and the like which fills the via and may extend over the barrier metal. The tungsten is etched back in standard manner to leave tungsten only within the via as well as a layer of barrier metal within the via which is optionally removed and over the oxide. A layer of titanium nitride is then deposited over the existing layer of titanium nitride (any aluminum alloy with current carrying capability can also be used), followed by a layer of aluminum alloy (preferably about 0.5% copper (Cu)) (any aluminum alloy with current carrying capability can also be used) and then followed by a blanket deposition of a conformal CVD film which encapsulates the entire structure fabricated up to that point. The CVD film is preferably one of titanium nitride, tungsten, titanium, silicon nitride, etc. CVD film is then isotropically etched. The resulting structure is as in the prior art, but with a sidewall encapsulating film of the CVD material. Since the material being etch is entirely the CVD material, the I-shaped structure of the prior art is avoided and the sidewalls are essentially straight along their entire length.

The benefits derived from the above described lead are: (1) improvement in electromigration due to the stress of the encapsulating film inhibiting extrusions or accumulation of metal transported from the voided region, (2) stress induced notching is reduced due to reduced surface diffusion and (3) the encapsulation film can act as a diffusion barrier.

DESCRIPTION OF THE PREFERRED EMBODIMENT

Figure 1A:
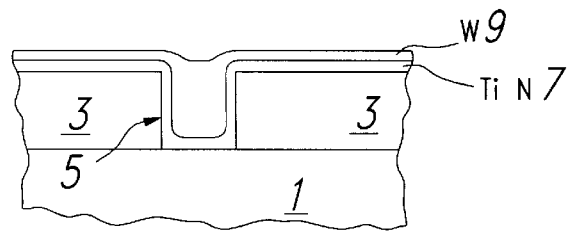
FIGS. 1a to 1f are a process flow for the fabrication of a lead in accordance with the present invention.

Referring first to FIG. 1a, there is shown a typical semiconductor silicon chip 1 to which electrical connection is to be made, such as to a pad thereon or the like. An oxide layer 3 is disposed over at least a portion of the surface of the silicon chip 1 and contains a via 5 therethrough extending down to the silicon chip to where the electrical connection is to be made. A layer of titanium nitride 7 is deposited in the via 5 as well as over the surface of the oxide layer 3 by sputtering. A layer of tungsten 9 is then conformally deposited to fill the via 5 and extend over the titanium nitride layer 7 by chemical vapor deposition.

Figure 1B:
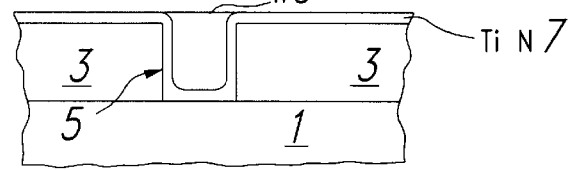
Figure 1C:
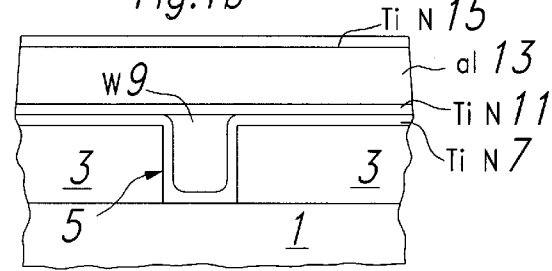
Figure 1D:
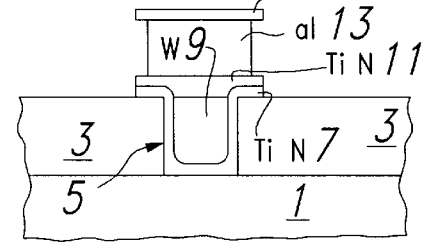

Referring now to FIG. 1b, the tungsten layer 9 is etched back so that it is now present only within the via 5 and then a layer of titanium nitride 11 is deposited over the exposed surface followed by a layer of aluminum or aluminum alloy 13, preferably aluminum having 0.5 percent copper which is then followed by a layer of titanium nitride 15 as shown in FIG. 1c. The structure of FIG. 1c is then masked over the via 5 and slightly beyond the via and isotropic etching then takes place down to the oxide layer 3 as shown in FIG. 1d, removing all of the titanium nitride layers 7 and 11, the aluminum layer 13 and the titanium nitride layer 15 except the portion thereof under the mask (not shown). The aluminum layer 15 is etched farther in than are the titanium nitride layers 7, 11 and 15 because the etch chemistry reacts faster toward the aluminum than it does to the titanium nitride.

Figure 1E:
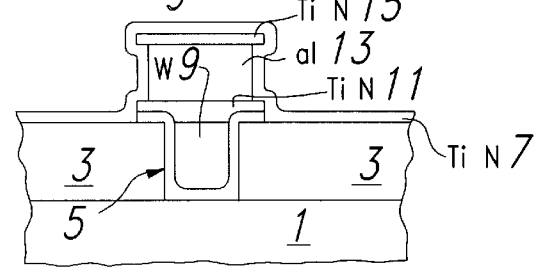
Figure 1F:
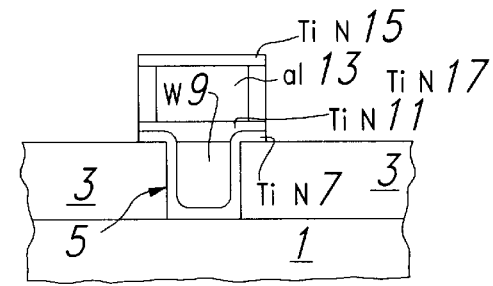

The structure of FIG. 1d is fully encapsulated by a blanket deposition of a conformal CVD film of titanium nitride 17 as shown in FIG. 1e which is then followed by an isotropic etch of the titanium nitride titanium nitride layer 17, leaving titanium nitride 17 as a sidewall on the aluminum layer 13 as shown in FIG. 1f.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of fabricating a lead for use in conjunction with a semiconductor device comprising the steps of:
   (a) providing a lead disposed on a surface having an electrically conductive metal layer disposed over a barrier layer over said surface and an anti-reflective coating on said electrically conductive metal layer remote from said surface; and
   (b) encapsulating said electrically conductive metal layer with a composition which prevents electromigration of said electrically conductive metal, wherein said electrically conductive metal layer has sidewalls which are indented relative to said barrier layer and said anti-reflective layer to form a I-shape, said composition disposed on said sidewalls to provide substantially vertical sidewalls on said lead.

2. The method of claim 1 wherein said step of encapsulating includes encapsulating said electrically conductive metal layer between said barrier layer and said anti-reflective layer.

3. The method of claim 1 wherein said composition is taken from the class consisting of TiN, W, Ti and $Si_3N_4$.

4. The method of claim 2 wherein said composition is taken from the class consisting of TiN, W, Ti and $Si_3N_4$.

5. The method of claim 1 wherein said step of encapsulating comprises the steps of depositing said composition over and around said lead in step (a) and isotropically etching away said composition to provide substantially vertical sidewalls on said lead.

6. The method of claim 4 wherein said step of encapsulating comprises the steps of depositing said composition over and around said lead in step (a) and isotropically etching away said composition to provide substantially vertical sidewalls on said lead.

7. The method of claim 1 wherein said surface is an oxide layer disposed on semiconductor material and further including the step of providing a via with electrically conductive material therein extending from said barrier layer to said semiconductor material.

8. A method of fabricating a lead for use in conjunction with a semiconductor device comprising the steps of:
   (a) providing a surface disposed on a semiconductor substrate and having a via with electrically conductive material therein extending to said substrate;
   (b) forming a lead disposed on a barrier layer on said surface having an electrically conductive metal layer disposed on a barrier layer on said surface and contacting said electrically conductive material and having sidewalls;
   (c) forming an anti-reflective coating on said electrically conductive metal layer remote from said surface;
   (d) encapsulating said electrically conductive metal layer with a composition to prevent electromigration of said electrically conductive metal, wherein said electrically conductive metal layer is indented relative to said barrier layer and said anti-reflective layer to form an I-shape with said barrier layer and said anti-reflective layer;
   (e) removing said composition except from said sidewalls of said electrically conductive metal layer to encapsulate said electrically conductive layer.

9. The method of claim 8 wherein said step of encapsulating includes encapsulating said electrically conductive metal layer between said barrier layer and said anti-reflective layer.

10. The method of claim 8 wherein said composition is taken from the class consisting of TiN, W, Ti and $Si_3N_4$.

11. The method of claim 9 wherein said composition is taken from the class consisting of TiN, W, Ti and $Si_3N_4$.

12. The method of claim 8 wherein said step of encapsulating comprises the step of chemically vapor depositing a conformal layer of said composition over the structure resulting after step (d) and then isotropically etching a portion of said composition to provide a sidewall on said electrically conductive metal layer conformal to the sidewalls of said barrier layer and said anti-reflective layer.

13. A lead for use in conjunction with a semiconductor device comprising:
   (a) a lead disposed on a surface having an electrically conductive metal layer disposed over said surface and a barrier layer disposed between said surface and said electrically conductive metal layer;
   (b) an anti-reflective coating on said electrically conductive metal layer remote from said surface; and
   (c) a composition to prevent electromigration of said electrically conductive metal encapsulating said electrically conductive metal layer, wherein said electrically conductive metal layer has sidewalls which are indented relative to said barrier layer and said anti-reflective layer to form a I-shape, said composition disposed on said sidewalls to provide substantially vertical sidewalls on said lead from a bottom surface of said barrier layer to a top surface of said anti-reflective layer.

14. The lead of claim 13 wherein said composition is taken from the class consisting of TiN, W, Ti and $Si_3N_4$.

15. The lead of claim 13 wherein said surface is an oxide layer disposed on semiconductor material, said oxide layer further including a via with electrically conductive material therein extending from said barrier layer to said semiconductor material.

* * * * *